United States Patent
Dubil et al.

(10) Patent No.: US 8,132,105 B1
(45) Date of Patent: Mar. 6, 2012

(54) CONTROL CODES FOR PROGRAMMABLE REMOTE SUPPLIED IN XML FORMAT

(75) Inventors: Thomas James Dubil, Morgan Hill, CA (US); Stuart Peter McKechnie, Saratoga, CA (US); Rudy Musschebroeck, Jette (BE); Yevgeniy Eugene Shteyn, Cupertino, CA (US); Stefaan M. Note, Berchem (BE); Frank Louis Boghe, Sunnyvale, CA (US)

(73) Assignee: Koninklijke Philips Electronics, N.V., Eindhoven (NL)

( * ) Notice: Subject to any disclaimer, the term of this patent is extended or adjusted under 35 U.S.C. 154(b) by 629 days.

(21) Appl. No.: 09/686,572

(22) Filed: Oct. 10, 2000

(51) Int. Cl.
*G06F 3/00* (2006.01)

(52) U.S. Cl. ........ 715/740; 715/748; 715/749; 715/760; 715/716

(58) Field of Classification Search ............... 345/740, 345/748, 749, 760, 716; 700/19, 20, 17, 700/83; 341/175, 176, 169; 571/740, 748, 571/749, 760, 716
See application file for complete search history.

(56) References Cited

U.S. PATENT DOCUMENTS

| | | | |
|---|---|---|---|
| 5,898,838 A | 4/1999 | Wagner | |
| 5,963,264 A * | 10/1999 | Jackson | 348/460 |
| 6,104,334 A * | 8/2000 | Allport | 341/175 |
| 6,111,569 A * | 8/2000 | Brusky et al. | 345/327 |
| 6,133,847 A * | 10/2000 | Yang | 340/825.22 |
| 6,157,319 A * | 12/2000 | Johns et al. | 340/825.72 |
| 6,344,769 B1 | 2/2002 | Giuroiu | |
| 6,374,296 B1 * | 4/2002 | Lim et al. | 709/225 |
| 6,397,186 B1 * | 5/2002 | Bush et al. | 704/274 |
| 6,401,059 B1 * | 6/2002 | Shen et al. | 703/27 |
| 6,407,594 B1 | 6/2002 | Milazzo et al. | |
| 6,407,779 B1 * | 6/2002 | Herz | 348/734 |
| 6,431,875 B1 * | 8/2002 | Elliott et al. | 434/322 |
| 6,437,836 B1 * | 8/2002 | Huang et al. | 348/734 |
| 6,446,192 B1 * | 9/2002 | Narasimhan et al. | 712/29 |
| 6,466,233 B1 * | 10/2002 | Mitani | 345/716 |
| 6,466,971 B1 * | 10/2002 | Humpleman et al. | 709/220 |
| 6,546,419 B1 * | 4/2003 | Humpleman et al. | 709/223 |
| 6,606,280 B1 * | 8/2003 | Knittel | 367/198 |
| 6,769,129 B1 * | 7/2004 | Perlman | 725/80 |
| 6,956,496 B1 * | 10/2005 | Herz | 340/825.22 |
| 7,130,895 B2 * | 10/2006 | Zintel et al. | 709/220 |
| 2001/0002115 A1 | 5/2001 | Hwang et al. | |
| 2001/0005197 A1 * | 6/2001 | Mishra et al. | 345/100 |
| 2002/0042915 A1 * | 4/2002 | Kubischta et al. | 725/38 |
| 2004/0090315 A1 * | 5/2004 | Mackjust et al. | 340/426.13 |
| 2005/0052423 A1 * | 3/2005 | Harris et al. | 345/169 |
| 2006/0200253 A1 * | 9/2006 | Hoffberg et al. | 700/19 |

FOREIGN PATENT DOCUMENTS

| | | |
|---|---|---|
| WO | 99/57649 | 11/1999 |
| WO | 0017738 A1 | 3/2000 |

OTHER PUBLICATIONS

"A Process and Tools for Multi-Modal Authoring of Web Content", *Research Disclosure* Jun. 1999, pp. 887-888.
Sigal: Position Statement: Intelligent Control Via the Web; Future of Embedded Internet-Embedded Workshop; Year Unknown, 2 page Document.

* cited by examiner

*Primary Examiner* — William L Bashore
*Assistant Examiner* — Mylinh Tran

(57) ABSTRACT

An Internet service makes available control codes for use on a programmable universal remote. The remote controls CE equipment through IR or RF commands. A server supplies the control codes as XML data that gets processed at the receiver's set top box or PC, or the remote itself, for being properly installed on the remote.

7 Claims, 1 Drawing Sheet

CONTROL CODES FOR PROGRAMMABLE REMOTE SUPPLIED IN XML FORMAT

FIELD OF THE INVENTION

The invention relates to remote control devices and to a service for enabling the programming of remote controls to be used with consumer electronics (CE) equipment.

BACKGROUND ART

Universal programmable remote control devices, e.g., the PRONTO™ made by Philips Electronics, are well known. The expression "universal remote" indicates a device that enables the end-user to control the majority of his/her collection of remotely controllable apparatus, regardless of the type or brand of the individual apparatus. This universal controllability is achieved, e.g., by accommodating on the remote a data base of multiple sets of existing control (IR or RF) codes, each particular set being associated with a particular type of apparatus of a particular brand. The universal remote is user-programmable and capable of learning or adopting new control codes and of associating them with a particular user-defined soft key or hard button. The PRONTO™, for example, has built-in RC-5 and RC-6 codes for Philips and Marantz equipment, IR-sending and IR-receiving eyes, and an RS232 serial port connector for after-market expansibility of the codes, e.g., via a PC. The PRONTO™ provides a GUI via an LCD touch screen and also has direct-access buttons for frequently used control functions. Built-in are customizable device templates for full control; the options to assign control functions to icons or buttons; options to delete and create icons or buttons; options to program and edit macros; a keyboard with soft keys for (re-) labeling buttons, icons and templates or the GUI's control panels. In short, the PRONTO™ is highly customizable in terms of the GUI's lay-out, appearance, labeling, organization and in terms of programming, editing and customizing the control functions.

SUMMARY OF THE INVENTION

The universal programmability of remote controls and other programmable or software-upgradeable CE apparatus is a valuable asset. It is an incentive for third parties to offer value-added features to the equipment's expandible functionality. In order to facilitate this, the inventors propose, among other things, to use a mark-up language format, preferably an XML (Extensible Markup Language) data format, in a service for supplying IR or RF commands for being installed on a remote control. The data can be supplied via a data network such as the Internet, or on a carrier such as a memory card. This data represents a control code to be installed on the remote that, when activated, determines the relevant IR or RF command. The data can be stored locally at the remote. An XML application, such as an XSL stylesheet, at the receiving end, operates on the data under control of instructions in the stylesheet. This application is used, for example, for control of generating the proper IR or RF commands based on the received data and for generating a GUI as an, e.g., HTML page on a suitable display.

If necessary, the data is converted to a proprietary format local to the remote before getting installed. An advantage of the invention resides in the fact that an open standard, such as XML/XSL for defining the behavior and appearance of a remote's GUI, allows development of supporting tools by third parties.

The invention relates specifically to a method of providing, in a mark-up language format, preferably XML, data representative of a control code for installation on a control device. Preferably, the data is provided via a data network, e.g., the Internet. The user is enabled to specify to a server on the network an apparatus for being controlled by the control device. The server then identifies a corresponding control code for being provided as the data in the mark-up language format. The method of the invention can comprise providing a GUI element for use on the control device, the GUI element being supplied as further data in the mark-up language format. The GUI element can comprise a graphical representation of another remote control device. This latter feature is especially interesting if the universal programmable remote is to become the user's main remote for his/her CE equipment. It is assumed that the universal remote has a touch screen GUI. All relevant control codes of the separate remotes for individual pieces of equipment are now programmed in the universal remote using the scenario briefly discussed above and in more detail below. Assume that the universal remote, such as the PRONTO™ can reserve one or more graphical control panels per piece of equipment. That is, the control functionalities per piece of equipment are clustered. The invention now shapes the graphical representation of these panels as an image of the remote dedicated to that piece of equipment. That is, the universal remote displays an image of the dedicated remote with the control functionalities represented as soft keys where the dedicated remote provides hard keys. This enables quick recognition by the user and also allows the user to effortlessly switch between manipulating the universal remote and the dedicated remote. This feature can also be provided independent of the XML invention.

Accordingly, the inventors propose to have a server provide data to an end-user, preferably in XML format, for programming, setting up and control of local CE equipment. Using XML, the content/service provider does not need to support all possible target devices. Accordingly, the data can be supplied and put together without having to consider the particularities of the destination platform on which the data is to be installed. An XML application (here: a parser) extracts the relevant items and attributes from the XML data received and transforms them to further data that can be installed and/or processed locally at the destination platform.

The XML/XSL concept is widely known. It is being used to present data on browsers and to direct browser activity. XML enables to have common data formats in order to share the format as well as the data. XML separates the information to be rendered from the rendering instructions. XML describes data using tags. Custom tags enable the definition, transmission, validation, and interpretation of data between applications. The tags specify what each piece of data represents. That is, the tags comprise the semantic information about the data. As a result, an electronic document in XML can be rendered in different manners. This concept is now applied in the invention to IR or RF remote controls. By being able to have control codes delivered to the end user as XML files, e.g., via the Internet, the user can process the files locally through appropriate applications on his/her PC or set-top box, or even on the remote itself, in order to set up the remote for control of CE equipment with the codes thus received.

More specifically, the IR or RF codes are described using XML. A number of parameters can be defined using XML tags, for example, carrier frequency, duty cycle, protocol type (FSK, biphase, PWM, etc.), repetition time, on/off times of the signal, bit pattern of the command code, semantic meaning of the code, type of device for which it is intended (CD, VCR, TV, DVD, etc.), the brand name of the specific protocol, etc. Preferably, these data fields are not all used within the remote: only the information required to transmit the actual IR or RF code needs to be stored. On a server, the brand name and device type can be used to run database queries, e.g., in order to allow selective downloads. For example, a set top box (STB) offers a dedicated service at its portal to download IR codes upon the user having entered input descriptive of the device to be controlled, its brand and type number.

As to the remote's GUI, currently the PRONTO™ uses a proprietary format as a configuration file. This file contains information about the types and names of devices supported by the PRONTO™. Per device, the GUI is organized as a collection of pages. The GUI displays one page at the time. A specific page comprises one or more panels and soft keys or buttons. A button is graphically represented by, e.g., a labeled icon. A particular panel may comprise one or more panels and/or one or more further buttons. With each button and panel are associated certain properties, such as positions on the remote's display when rendered, labels, bitmaps, a function and its arguments (e.g., send+IR code, beep+sound samples, jump+device and page number, delay+time, etc). In the invention, all this information is preferably described using the XML.format. This, in combination with XSL, is used to define the GUI of a touch screen remote.

The invention enables the following scenario. The user notifies a dedicated server on the Internet of the purchase of the type, brand, serial number, etc., of a new CE apparatus for which he/she would like add the codes to the universal programmable remote. The remote has a touch screen and display monitor. The new apparatus has come with a simple proprietary remote. The server now downloads to the user's home network the control codes in XML format, plus a tagged file for creating a bitmap of the proprietary remote on the universal remote's display monitor. When the control codes and data for the bitmap generation have been installed, the user can control the new apparatus through the virtual remote displayed on the universal remote's touch screen display monitor. Touching the screen in the location of a graphic representation of a proprietary remote's button causes the universal remote to send the corresponding IR or RF code. Note that the XML tags determine the rendering of the graphics image depending on the XSL stylesheet on the receiving platform.

A further interesting aspect of the invention is the following. The number of information appliances with Internet connectivity, e.g., enhanced TV's, set-top boxes (STB's), PDA's, smart phones, etc., and with different capabilities, e.g., processing power, memory capacity, display screen real estate, screen resolution, network connection, is rapidly growing. XML and XSL provide the basic building blocks of a framework for generic and flexible information exchange over the Internet that can be tailored to different machine conditions and user preferences. This framework is now applied in the invention to build an electronic program guide (EPG) or electronic content guide (ECG) that adapts the representation of, e.g., TV programs and other content information stored in an XML format to different information appliances and user profiles. Dynamically modified XSL stylesheets model the capabilities of the information appliance and the user preferences. The stylesheets translate and format the program information represented in XML in a Web presentation language such as HTML. In this manner, the semantics of the program information is separated from its presentation language syntax. The EPG or ECG is downloaded from the user's home network onto a programmable remote that has a touch screen capability. In addition, the EPG or ECG (see U.S. Ser. No. 09/568,932, mentioned below) is provided together with control codes in XML in order to enable a user to control, e.g., selection of, and playing-out or recording a specific one of the programs in the EPG/ECG rendered on the remote's display.

BRIEF DESCRIPTION OF THE DRAWING

The invention is explained in further detail, by way of example, and with reference to the accompanying drawing, wherein.

DETAILED EMBODIMENTS

Figure 1:
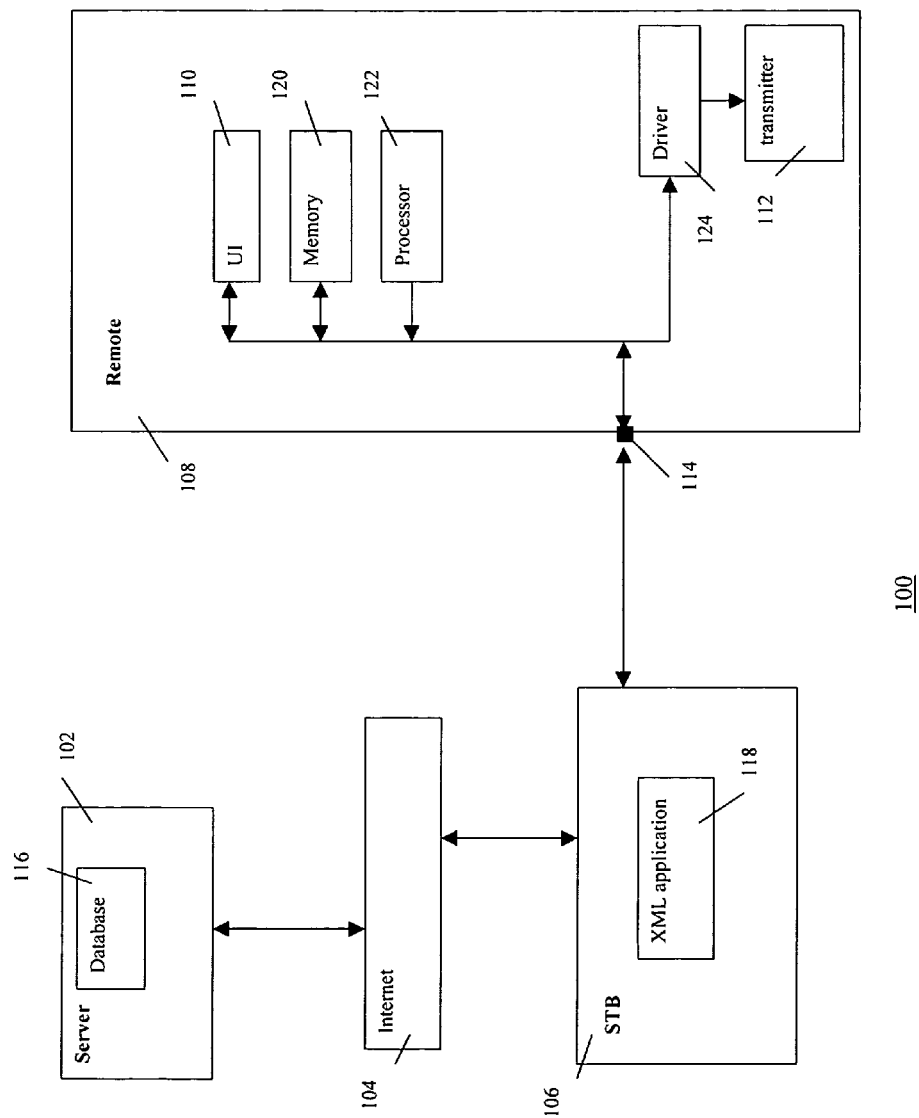
FIG. 1 is a block diagram of a system of the invention.

XML is emerging as the universal format for structured documents and data on the Web. XML makes it relatively straightforward to define new document types, to author and manage documents and to transmit and share the documents across the Internet. XSL is used for defining stylesheets, and provides a language for translating XML documents and an XML vocabulary. XSL specifies the formatting of semantics. Information in XML format on the Web can be transformed in a presentation format such as HTML, WML or SMIL with XSL stylesheets. This separation of semantics and presentation makes possible platform customization and user personalization of Web content. In an XSL transformation, an XSL processor or application reads an XML document and an XSL style sheet. Based on the instructions in the XSL style sheet, the XSL processor or application supplies a new XML, HTML or otherwise formatted document. The invention now uses this concept in a system or a service, wherein control codes for use on, e.g., a remote control device are being supplied in an open standard format, such as XML.

The invention covers both the usage of XML for IR or RF codes and for the GUI. The codes can be described using a number of parameters defined by XML tags. Examples have been mentioned above: carrier frequency, duty cycle, protocol type (FSK, biphase, PWM, etc.), repetition time, on/off times of the signal, bit pattern of the command code, meaning of the code, type and brand of the device for which it is intended (CD, VCR, TV, etc.), the name of the specific control protocol, etc. Some of these data fields are used to enable to run a query on a server. Only that data required to have the remote send the particular control code is stored at the remote itself, or at an intermediate device such as the user's PC or set-top box. On the server, the brand name and device type is used to query the control code database to allow selective downloads.

FIG. 1 is a block diagram with main components of an information processing system 100 in the invention. System 100 comprises a server 102 connected via the Internet 104 to an appliance 106, e.g., a STB or a PC, at the user's home. The user has a universal programmable remote control device 108 with a touch screen UI 110. Device 108 has a transmitter 112 for sending an IR-control code or an RF-control code to electronics equipment (not shown), such as TVs, VCRs, CD players, STB's, DVD players, audio pre-amplifiers and tuners, etc., on the home network. Remote control device 108 has an input 114, e.g., a serial or parallel port or an IR sensor or transceiver, for communicating with appliance 106.

Server 102 has a database 116 with an inventory of IR and RF control codes for commercially available CE equipment of various brands and types. The service provider updates database 116 when new appliances are becoming available on the market. The codes are formatted as XML documents. That is, the relevant parameters of a particular control code or command are defined using XML tags. For example, tags are defined for the relevant controllable apparatus to which a code pertains, for its type number, for the IR or RF carrier frequency, for the duty cycle, the protocol type, for the repetition time, for the on/off times of the signal, etc. The brand name and device type tags are used to run database queries on server 102, e.g., in order to allow selective downloads.

The user requests via appliance 106 a code set from server 102 for control of the apparatus, type, brand, serial no., etc., as specified by the user and to be controlled via remote 108. This is achieved, e.g., by having the user fill out an electronic template at the service's web site and returning the template's information to server 102. Server 102 runs a query and, assuming that there is a match, supplies the associated set of codes via Internet 104 to appliance 106 as an XML document. Appliance 106 has an XML application 118 that extracts the data based on the relevant tags and interprets the data according to the semantics of the tags in order to generate the control codes and/or the GUI panels for remote 108. The GUI panel is preferably, but not necessarily, an HTML page. The control codes and/or GUI panels are then supplied to remote 108 via input 114 for being installed. For example, remote 108 is set into a programming mode for receiving the code at input 114 and for storing the code in a memory 120, e.g., a flash memory, under control of a processor 122. If UI 110 has a specific icon reserved for this control option, the user can instruct remote 108 to cause a driver 124 to control transmitter 112 for sending the IR or RF code.

As to the rendering of the graphical representation of the GUI at remote 108, the XML data matching the user's query at server 102 can be converted to the presentation data (WML, HTML, possibly CCF) at server 102 itself, using an XSL stylesheet. However, in this case server 102 needs to have information about remote 108 as to, e.g., its specific screen size, resolution and supported image format, so as to determine the correct XSL stylesheet to allow the data to be rendered for this specific remote. Alternatively, in case remote 108 receives its codes from server 102 via appliance 106, here an STB, part of the functionality to generate the GUI can be moved to appliance 106. Then, server 102 has only XML data but no stylesheets. This means that the service provider does not need to be aware of the target client device, here remote 108. Appliance 102 accesses server 102 to obtain the control code data. Appliance 102 can easily obtain the information about the target device, here remote 108, and its manufacturer or distributor can provide the proper XSL stylesheet and software required to generate the target format (WML, HTML, CCF). In yet another configuration, the XSL information and the XML/XSL combination is handled on the remote 108 itself, appliance 106 then merely being a conduit between server 102 and remote 108, wherein remote 108 accommodates the stylesheet information itself.

Note that conversion from an XML description into a dedicated format supported by remote control 108 can also be applied to the IR or RF control codes themselves. Again the conversion can be performed at server 102, at appliance 106 or at remote 108 itself.

The invention could also be implemented using a tagging or mark-up language other than XML implement the invention, and other style-sheets than XSL.

The following patent documents are incorporated herein by reference, among other things to provide a context for the current invention:

U.S. Ser. No. 09/434,155 filed Nov. 4, 1999 for Martin Freeman and Bonghan Cho for REMOTE CONTROL DEVICE WITH LOCATION DEPENDENT INTERFACE. This document relates to a programmable remote control unit that is capable of initiating retrieval of a control configuration from a storage device external to the unit. The unit comprises a memory to store the retrieved control configuration; a display for display of icons representing the configuration; and a touch screen for entering a selection based on the icons displayed. The storage device is a component of a CE apparatus. By storing or backing-up the control configuration for a specific apparatus in the apparatus itself, the remote is made truly universally programmable.

U.S. serial 09/427,821 filed Oct. 27, 1999 for Joost Kemink and Richard Sagar for PDA HAS WIRELESS MODEM FOR REMOTE CONTROL VIA THE INTERNET. This document discloses a PDA combined with a wireless modem to enable remote control of CE equipment via the Internet and a local home server.

U.S. Ser. No. 09/271,200 filed Mar. 17, 1999 for Jan van Ee for FULLY FUNCTIONAL REMOTE CONTROL EDITOR AND EMULATOR. This document relates to a universal programmable remote control device. The device has programmability functions that enable the end-user to customize the device through editing or programming the device's control functionalities. The programming can be achieved via a PC. The control configuration created via an editor on the PC can be downloaded into the device. The PC has emulator software to test the configuration before downloading. The emulator software and the remote's control software are made identical as a consequence of a software layer that abstracts from the remote's hardware. The emulator for the end-user is thus obtained as an almost free byproduct of the software development phase at the manufacturer.

U.S. Ser. No. 09/160,490 filed Sep. 25, 1998 for Adrian Turner et al., for CUSTOMIZED UPGRADING OF INTERNET-ENABLED DEVICES BASED ON USER-PROFILE. This document relates to a server system that maintains a user profile of a particular end-user of consumer electronics network-enabled equipment and also has a data base of new technical features for this type of equipment. If there is a match between the user-profile and a new technical feature, and the user indicates to receive information about updates or sales offers, the user gets notified via the network of the option to obtain the feature.

U.S. Ser. No. 09/568,932 filed May 11, 2000 for Eugene Shteyn and Ruud Roth for ELECTRONIC CONTENT GUIDE RENDERS CONTENT RESOURCES TRANSPARENT. This document relates to a data management system on a home network. The system collects data that is descriptive of content information available at various resources on the network. The data is combined in a single menu to enable the user to select from the content, regardless of the resource. Known EPG's still focus on the device or apparatus that provides the content information, rather than on the content information itself regardless of its resource and/or regardless of its time of availability, e.g., broadcast. That is, the known guides are device-centric and broadcast-centric rather than content-centric, whereas the user is typically more interested in the "what" of the content information than in the "wherefrom". Recording devices with personalization features in a digital context, such as the HDD-based Personal TV Receiver from Tivo, are changing the perspective of selecting content information. However, it is no longer relevant to the consumer when what program is being broadcasted by a broadcast station or supplied by another service provider, such as in a video-on-demand service. With such a digital recorder there is always content information available for selection and there is always content information that is available now. Further, content information is not limited to video or audio. Content also includes Internet pages, previews, ads, email, etc. Content is also not limited to what is being distributed in a broadcast, but instead can come from any resource, e.g., locally recorded on a previous occasion, interactive Internet sites, a DVD or CD jukebox, etc. Relevant is that the content is immediately available to the consumer, regardless its resource, delivery mechanism or delivery time. Accordingly, the data management system combines the data of an EPG with other data for other types of content information, typically within the context of a home entertainment system. The system comprises a data base for representing schedule information associated with scheduled content information from a content provider such as a broadcasting station or a video-on-demand (VOD) service. In addition, the data base also represents inventory information that is associated with content information available from another resource, e.g., as recorded at the consumer's digital Personal TV Receiver during previous broadcasts, or from a CD or DVD jukebox. Accordingly, the invention introduces a general type of guide, herein after referred to as an electronic content guide (ECG).

U.S. Ser. No. 09/519,546 filed Mar. 6, 2000 for Erik Ekkel for PERSONALIZING CE EQUIPMENT CONFIGURATION AT SERVER VIA WEB-ENABLED DEVICE. This document relates to facilitating the configuring of CE equipment of the consumer by means of delegating the configuring to an application server on the Internet. The consumer enters his/her preferences in a specific interactive Web page through a suitable user-interface of an Internet-enabled device, such as a PC or set-top box or digital cellphone. The application server generates the control data based on the preferences entered and downloads the control data to the CE equipment itself or to the Internet-enabled device.

U.S. Ser. No. 09/062,364 filed Apr. 17, 1998, and now allowed, for Sung Choi and Jan van Ee for GRAPHICAL USER INTERFACE TOUCH SCREEN WITH AUTO ZOOM FEATURE. This document relates to a graphical user interface (GUI) touch screen for displaying a user-controllable function of an electronic device. The GUI comprises means for displaying the function as an icon. The function corresponds to a plurality of user-selectable features. The icon is displayed with the plurality of the user-selectable features at a first scale size. The GUI has means for displaying a subset of the displayed features at a second scale size that is larger than the first scale size, upon a user touching an area of the icon. This facilitates a selection of a select one of the subset of features.

U.S. Ser. No. 09/619,426 filed Jul. 19, 2000 as a Continuation-in-Part of U.S. Ser. No. 09/062,364, for Jan van Ee for HAND-HELD WITH AUTO-ZOOM FOR GRAPHICAL DISPLAY OF WEB PAGE. This document relates to a mobile phone that has a display with a touch screen. The device has a browser and is capable of retrieving a Web page from the Internet. The page is first displayed in its entirety. The user can recognize the page's general lay-out and presence of hyperlinks. When the user touches a particular location on the touch screen that corresponds to a portion of the page's image, the portion gets displayed so as to fill the display's area. Thus, the user can browse the Web with a display of limited size.

With regard to the last two patent documents above incorporated by reference, the expanding icon serves to facilitate recognition and user-operation. It can be used to provide graphical representations of one or more standard remotes on the display of a universal programmable remote that has an LCD touch screen functionality, such as the PRONTO™ of Philips Electronics. The graphical representations can also be made to expand once selected. More specifically, on a touch screen remote such as the PRONTO™, icons are provided, e.g., programmed as discussed above, that each symbolize the controls for a specific apparatus. The specific icon is a graphical representation of the standard remote for the specific apparatus. Touching the icon magnifies the image of the icon so that the buttons of the displayed standard remote are shown at a scale large enough to serve as soft keys. Once the PRONTO™ has been programmed, the user immediately knows how to operate the "softremote" represented by the expanded icon. Recognition is easy as there is no discrepancy between the soft remote and the hard remote emulated.

U.S. Ser. No. 09/619,426 filed Jul. 19, 2000 for Jan van Ee for HAND-HELD WITH AUTO-ZOOM FOR GRAPHICAL DISPLAY OF WEB PAGE. This document relates to a handheld such as a mobile phone or a remote control that has a display with a touch screen. The phone has a browser and is capable of retrieving a Web page from the Internet. The page is first displayed in its entirety. The user can recognize the page's general lay-out and presence of hyperlinks. When the user touches a particular location on the touch screen that corresponds to a portion of the page's image, the portion gets displayed so as to fill the display's area. Thus, the user can browse the Web with a display of limited size. Similarly, the remote has a limited screen real estate. The double-touch interaction enables the user to interact conveniently with control options represented by softkeys or icons that are logically clustered on the same virtual panel.

U.S. Ser. No. 09/653,784 filed Sep. 1, 2000 for Frank Caris, Erik Ekkel and Tom Dubil for STB CONNECTS REMOTE TO WEB SITE FOR CUSTOMIZED CODE DOWNLOADS. This patent document relates to a set top box (STB) being marketed together with a programmable remote. The remote has a dedicated button to connect the STB to a specific server on the Internet. The consumer can notify the server of his/her other CE equipment, which he/she desires to be controllable through the same remote as the one that came with the STB. The server downloads to the STB data representative of the relevant control codes. The STB is provided with means to program the remote with these codes. In return the server has obtained detailed and accurate information about this consumer's equipment. A reliable customer base can thus be built for streamlining Help Desk operations.

We claim:

1. A method of configuring and using a universal programmable remote control device, the method comprising:

enabling a user to specify to a server on the internet at least one consumer electronics (CE) apparatus to be controlled by the universal programmable remote control device which universal programmable remote control device has a touch screen graphical user interface (GUI), the server on the internet including a database of control code sets, and wherein each CE apparatus to be controlled (i) has a corresponding simple dedicated proprietary remote control device with a control panel and (ii) is not preconfigured to deliver or cause delivery of its respective control code set to any control device, further wherein each control code set in the database of the server on the internet corresponds to a given dedicated proprietary remote control device of a respective CE apparatus to be controlled;

enabling the server on the internet, in response to a user specification to the server of a type, brand, and serial number for the at least one CE apparatus, (i) to identify a control code set corresponding to each specified CE apparatus to be controlled and (ii) to provide the identified control code set as data in an extensible mark-up language (XML) format;

providing each identified control code set over the internet to a home network through which the universal programmable remote control device can access the corresponding provided extensible mark-up language format control code set, the extensible mark-up language format control code set for each specified CE apparatus to be controlled including (1) a code set representative of infra-red (IR) or radio-frequency (RF) commands to control a state of the specified CE apparatus to be controlled and (2) code to control the touch screen GUI of the universal programmable remote control device to display a graphical representation of the control panel of the dedicated proprietary remote control device of the specified CE apparatus to be controlled, wherein the graphical representation comprises an image of icons and soft keys corresponding to an image of actual control panel hard keys of the respective dedicated proprietary remote control device of the specified CE apparatus to be controlled to thereby enable quick recognition of the dedicated proprietary remote control device as displayed on the touch screen GUI while manipulating the universal programmable remote control device;

the control code set not being usable by the universal programmable remote control device or by the specified CE apparatus to be controlled until the control code set is (i) converted via an extensible stylesheet language (XSL) application into commands for installation and local processing on the universal programmable remote control device and (ii) transmitted from the universal programmable remote control device to the specified CE apparatus to be controlled by an infra-red (IR) or radio-frequency (RF) transmission independent of the internet;

enabling the universal programmable remote control device to convert the installed and locally processed control code set into (1) actual IR or RF code associated with commands to control the specified CE apparatus, wherein only information that is required to transmit the actual IR or RF code is stored, and (2) the soft keys and the graphical representation of the icons on the touch screen GUI of the universal programmable remote control device such that the touch screen GUI of the universal programmable remote control device depicts the image of the actual control panel of the dedicated proprietary remote control device corresponding to the specified CE apparatus; and using the soft keys of the displayed control panel image of the respective dedicated proprietary remote control device on the touch screen GUI to enable the universal programmable remote control device to send the actual IR or RF code associated with commands to the specified CE apparatus to be controlled via the IR or RF transmission.

2. The method of claim 1, wherein the control code comprises part of an electronic program guide (EPG) or electronic content guide (ECG).

3. A universal programmable remote control device configured for receiving a control code set from a source over a bidirectional data network, the control code set comprising data in an extensible mark-up language (XML) format, the control code set representative of (1) infra-red (IR) or radio-frequency (RF) commands to control a state of a selected consumer electronics (CE) apparatus to be controlled and (2) soft key positions and icons for a graphical representation image of control keys of a simple dedicated proprietary remote control device corresponding to the selected CE apparatus to be controlled, wherein the selected CE apparatus is not preconfigured to deliver or cause delivery of its respective control code set to any control device, the remote control device comprising:

a graphical user interface (GUI) display panel on which the soft keys and icons are rendered;

the universal programmable remote control device being configured to use the control code set representative of the soft key positions and icons for control of the selected apparatus via rendering the graphical representation image on the GUI display panel depicting an actual image of dedicated proprietary remote control device with the hard control keys of the dedicated proprietary remote control device for the selected CE apparatus in which the soft key positions and icons for selecting the commands for the selected CE apparatus are in the same location as the corresponding hard control keys of the dedicated proprietary remote control device such that when a user switches between the universal programmable remote control device and the dedicated proprietary remote control device, the control keys are in the same position and have the same function as the dedicated proprietary remote control device to thereby enable quick recognition of the dedicated proprietary remote control device as displayed on the touch screen GUI while manipulating the universal programmable remote control device;

the universal programmable remote control device being configured to convert via an extensible stylesheet language (XSL) application the control code set from a form that is not usable by the universal programmable remote control device or on the selected CE apparatus to be controlled into (1) actual IR or RF code associated with commands for installation and local processing on the universal programmable remote control device that are usable by the selected CE apparatus to change a state of the selected CE apparatus, wherein only information that is required to transmit the actual IR or RF code is stored, and (2) the soft keys and the graphical representation of the icons on the touch screen GUI of the universal programmable remote control device such that the touch screen GUI of the universal programmable remote control device depicts the image of the actual control panel of the dedicated proprietary remote control device corresponding to the selected CE apparatus; and a transmitter for converting, in response to a user selection of a soft key of the control panel image of the dedicated proprietary remote control device displayed on the touch screen GUI, at least one selected command into an infrared (IR) or radio-frequency (RF) signal which is transmitted to control the selected CE apparatus.

4. The device of claim 3, wherein the bidirectional data network includes the internet, and wherein the source is located on the internet and remote from the selected apparatus and the bidirectional data network.

5. A method comprising:

enabling each of a plurality of users to specify to a server, over a bidirectional data network, a user specified consumer electronics (CE) apparatus for being controlled by a universal programmable remote control device of a user;

enabling the server to identify, in response to a user specification of type, brand, and serial number for a respective user specified CE apparatus, extensible mark-up language (XML) tags that specify control code sets included in data in XML language format, the control code sets being representative of (1) infra-red (IR) or radio-frequency (RF) control codes for controlling the respective user specified CE apparatus and (2) instructions for rendering icons and soft buttons on a graphical user interface (GUI) touch screen which emulate control keys of a simple dedicated proprietary remote control device for the respective user specified CE apparatus, wherein the respective user specified CE apparatus is not preconfigured to deliver or cause delivery of its respective control code set to any control device; and enabling the server to communicate over the bidirectional data network with a home network that includes the user's universal programmable remote control device for delivery of the control code sets to the universal programmable remote control device, wherein the control code sets are not directly usable by the universal programmable remote control device or the user specified CE apparatus until conversion of the control code sets by the home network via an extensible mark-up language (XML) application into actual IR or RF code associated with commands (i) for being installed and locally processed by the universal programmable remote control device that are usable by the user specified CE apparatus to change a state of the user specified CE apparatus, wherein only information that is required to transmit the actual IR or RF code is stored, and (ii) that can be sent by the universal programmable remote control device to the user specified CE apparatus independent of the bidirectional data network, wherein the graphical representation comprises an image of icons and soft keys that corresponds to an image of actual control panel hard keys of the dedicated proprietary remote control device of the user specified CE apparatus to be controlled to thereby enable quick recognition of the dedicated proprietary remote control device as displayed on the touch screen GUI while manipulating the universal programmable remote control device, the touch screen GUI of the universal programmable remote control device depicting the image of the actual control panel of the dedicated proprietary remote control device corresponding to the user specified CE apparatus.

6. The method of claim 5, wherein the bidirectional data network includes the internet, the user specifying the apparatus to be controlled over the internet to the server, which server is remote from and not a part of the home network or the specified apparatus, and the control codes are sent via the internet to the home network to the universal programmable remote control device.

7. The method of claim 5, wherein rendering the icons and soft buttons to emulate the control keys of the dedicated remote control device for the specified apparatus includes:

rendering each icon or soft button in a same relative location as a corresponding control key of the dedicated remote control device for the specified apparatus which performs the same function.

\* \* \* \* \*